United States Patent [19]

Schwabe et al.

[11] Patent Number: 4,562,638

[45] Date of Patent: Jan. 7, 1986

[54] METHOD FOR THE SIMULTANEOUS MANUFACTURE OF FAST SHORT CHANNEL AND VOLTAGE-STABLE MOS TRANSISTORS IN VLSI CIRCUITS

[75] Inventors: Ulrich Schwabe, Munich; Christoph Werner, Krailling, both of Fed. Rep. of Germany

[73] Assignee: Siemens Aktiengesellschaft, Berlin & Munich, Fed. Rep. of Germany

[21] Appl. No.: 662,446

[22] Filed: Oct. 18, 1984

[30] Foreign Application Priority Data

Nov. 9, 1983 [DE] Fed. Rep. of Germany ....... 3340560

[51] Int. Cl.$^4$ ............................................ H01L 21/82
[52] U.S. Cl. .................... 29/577 C; 29/571; 29/576 B; 29/578
[58] Field of Search ................. 29/571, 576 B, 577 C, 29/578; 148/1.5

[56] References Cited

U.S. PATENT DOCUMENTS

| | | | |
|---|---|---|---|
| 4,173,818 | 11/1979 | Bassous et al. | 29/578 |
| 4,214,359 | 7/1980 | Kahng | 29/578 |
| 4,366,613 | 1/1983 | Ogura et al. | 29/577 C |
| 4,434,543 | 3/1984 | Schwabe et al. | 29/571 |
| 4,459,741 | 7/1984 | Schwabe et al. | 29/571 |

OTHER PUBLICATIONS

1983 IEEE International Solid-State Circuits Conference; Session VIII: Modeling and Technology; "An 18V Double-Level Poly CMOS Technology for Nonvolatile Memory and Linear Applications", by Roger A. Haken et al, pp. 90 and 91.

*Primary Examiner*—Brian E. Hearn
*Assistant Examiner*—Hunter L. Auyang
*Attorney, Agent, or Firm*—Hill, Van Santen, Steadman & Simpson

[57] ABSTRACT

A manufacturing method for VLSI MOS field effect transistor circuits having digital and analog functions performed by short channel transistors and analog transistors integrated on one chip. An n-tube manufacture is performed wherein as soft as possible a field progression in front of a drain-side pn-junction of the analog transistor is achieved. This occurs by means of an additional drain implantation (curve II) with drive-in diffusion before the actual source/drain implantation (curve I) of the n-channel transistors. Both the additional implantation as well as the source/drain implantation are carried out with phosphorous ions. The dosage of the additional implantation lies one to two orders of magnitude below the dosage of the actual implantation, and the penetration depth x in the additional drive-in diffusion is about twice as great as the penetration depth x of the actual source/drain regions. The method is applied in the manufacture of VLSI CMOS circuits.

3 Claims, 14 Drawing Figures

METHOD FOR THE SIMULTANEOUS MANUFACTURE OF FAST SHORT CHANNEL AND VOLTAGE-STABLE MOS TRANSISTORS IN VLSI CIRCUITS

RELATED APPLICATION

This application is related to U.S. Pat. No. 4,525,920, issued July 2, 1985.

BACKGROUND OF THE INVENTION

The patent application relates to a method for the simultaneous manufacture of fast short-channel (type A) and voltage-stable MOS transistors (type (B) as are employed in VLSI (very large scale integration) circuits where digital and analog functions are integrated on one chip. P-doped or n-doped tubs are generated in the silicon substrate for the incorporation of the respective n-channel or p-channel transistors. The corresponding dopant atoms for setting the various transistor threshold voltages are introduced into the tubs by means of multiple ion implantation. The masking for the individual ion implantations occurs by means of photoresists and/or by means of silicon oxide or silicon nitride structures. The production of the source/drain and gate regions as well as the generation of the intermediate and insulating oxide and of the interconnect level is undertaken in accordance with known method steps of MOS technology.

Two types of MOS transistors are required for modern VLSI circuits in which digital and analog functions are integrated on one chip:

Type A: short channel transistors which should enable very high switching speeds, but need not withstand any voltages higher than the supply voltage ($V_{DD}=5$ V);

Type B: analog transistors at which higher drain voltages can occur (up to $V_{DD}=12$ V), but whose switching speed is not subject to such high demands.

SUMMARY OF THE INVENTION

An object of the present invention is to manufacture both transistors types simultaneously with the fewest additional process steps possible.

The conference volume of the International Solid-State Circuits Conference, February 1983, pages 90/91, incorporated herein by references, discloses in an article by R. A. Haken et al that those n-channel transistors that can be exposed to higher voltages can be provided with an additional, lowly doped connection diffusion at the source/drain regions (lightly doped drains).

The invention pursues a different course and resolves the above object given a method of the type initially cited by means of the following method steps:

(a) application of a first double layer to a p-doped silicon substrate, the first double layer comprising silicon oxide and silicon nitride;

(b) production of the n-tubs by means of a phosphorous, arsenic, or antimony ion implantation after completion of the masking of the remaining regions with a photoresist layer and after removal of the silicon nitride layer in the n-tub region;

(c) stripping the photoresist mask;

(d) execution of a local oxidation process for the purpose of generating a masking oxide for the subsequent boron deep implantation outside of the n-tub region and first in-diffusion step of the phosphorous, arsenic, or antimony ions;

(e) stripping the silicon nitride structures and further driving-in of the n-tub;

(f) execution of a first boron ion implantation;

(g) surface-wide stripping of the oxide masking;

(h) application of a second double layer to the substrate surface, the second double layer comprising silicon oxide and silicon nitride, and structuring the silicon nitride layer covered with a photoresist mask such that the active transistor regions remain covered by the silicon nitride layer;

(i) stripping the photoresist mask;

(j) application of a further photoresist layer above the n-tub regions;

(k) execution of a second boron ion implantation for the generation of the n-channel field-implanted regions;

(l) stripping the photoresist structures;

(m) generation of the field oxide regions by means of local oxidation upon employment of the silicon nitride layer as masking;

(n) removal of the silicon nitride layer and of the oxide layer lying therebelow and execution of an oxidation process for the manufacture of the gate oxide;

(o) execution of a third, surface-wide boron ion implantation for doping the n-channel and p-channel such that the implantation dose is selected to match the other implantations such that as symmetrical as possible a threshold voltage $|U_T|$ is achieved for the n-channel and for the p-channel transistor;

(p) deposition and structuring of polysilicon for the formation of the gate regions;

(q) execution of an oxidation process such that the oxide layer does not mask the following source/drain implantation of the p-channel and n-channel transistors, but can have a masking effect in the regions of the polysilicon edge;

(r) application of a photoresist masking to the p-channel transistor regions, the n-channel transistors and the source regions as well as the field oxide edge of the drain regions of the B-type n-channel transistors;

(s) execution of a phosphorous ion implantation in the drain region of the n-channel transistor region;

(t) in-diffusion of the phosphorous ions after stripping the photoresist mask;

(u) execution of a further phosphorous ion implantation for the purpose of generating the source/drain regions of the A-type n-channel transistors and of the B-type after masking the n-tub regions with photoresist;

(v) execution of a photoresist technique for masking the n-channel transistor region;

(w) execution of a fourth boron ion implantation for generating the source/drain regions of the p-channel transistors;

(x) removal of the photoresist masking; and (y) generation of the insulating layer, of the contact hole regions, and of the metal interconnect level in a known manner.

Except for the double phosphorous ion implantation according to method steps (s) and (u) after completion of the photoresist masking according to method step (q) and the diffusion process according to method step (t), the inventive method is identical to that proposed in the German patent application No. P 33 14 450.8, corresponding to U.S. Pat. No. 4,525,920, issued July 2, 1985, incorporated herein by reference, and requires only one additional mask (method step (q)). This, however, is not critical since it need only cover the source regions to be isolated from the deep drain implantation and the drain regions of the digital circuit portion. In contrast to the known solution, the implantation itself occurs in self-adjusting fashion through the same window as the following actual source/drain implantation.

The method according to the teaching of the invention can be applied to both NMOS as well as CMOS circuits, whereby CMOS circuits can involve an N-tub as well as a P-tub process.

DESCRIPTION OF THE PREFERRED EMBODIMENTS

Figure 1:
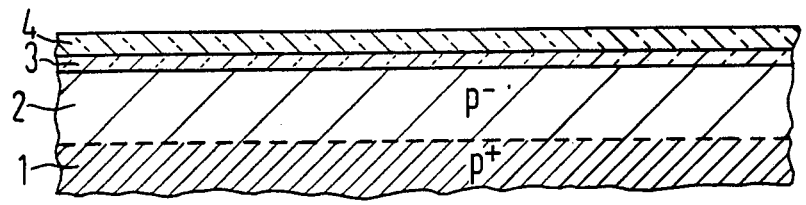
FIGS. 1 through 13 show the method steps essential to the invention in section for a CMOS N-tub process with additional analog transistors.

FIG. 1: At the beginning of the process sequence, a double layer consisting of an $SiO_2$ layer 3 (50 nm) and of a silicon nitride layer 4 (140 nm) is deposited on a p+ doped silicon substrate 1 (0.01 through 0.02 Ohm cm) oriented in a (100) direction, and which is provided with a p− doped epitaxial layer 2 (6 to 10 μm thick, 20 Ohm cm).

Figure 2:
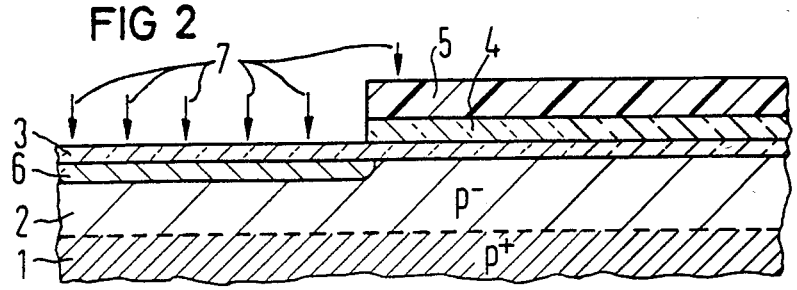

FIG. 2: The silicon nitride layer 4 is structured with the assistance of a photoresist structure 5 and the n-tub 6 is generated by means of a phosphorous ion implantation having a dosage and energy of 2 to $2.5 \times 10^{12}$ cm$^{-2}$ and 160 keV, respectively.

Figure 3:
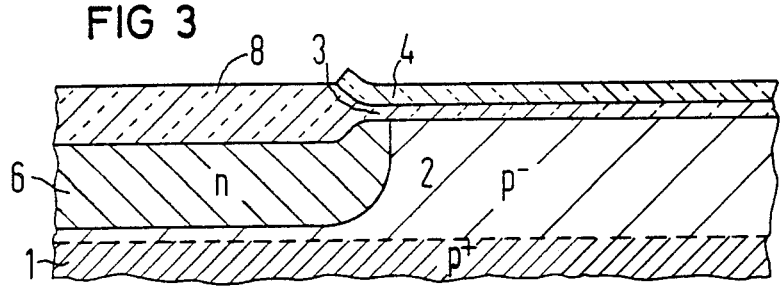

FIG. 3: After stripping the photoresist structure 5, a local oxidation process is executed for generating a masking oxide 8 (500 nm) for the following boron deep implantation 9, and the phosphorous ions 7 are thereby diffused into the n-tub region 6.

Figure 4:
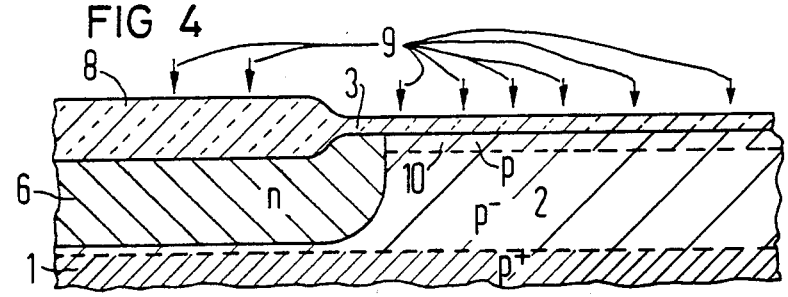

FIG. 4: After stripping the silicon nitride structure 4, a further in-diffusion step of the n-tub (drive-in≈2 to 6 μm) and the boron deep implantation (see arrows 9) have a dosage and energy of 3 to $7 \times 10^{11}$ cm$^{-2}$ and 60 keV, respectively, is executed through the local oxide mask 8 in self-adjusting fashion relative to the n-tub 6. The p-doped zone 10 thus arises.

Figure 5:
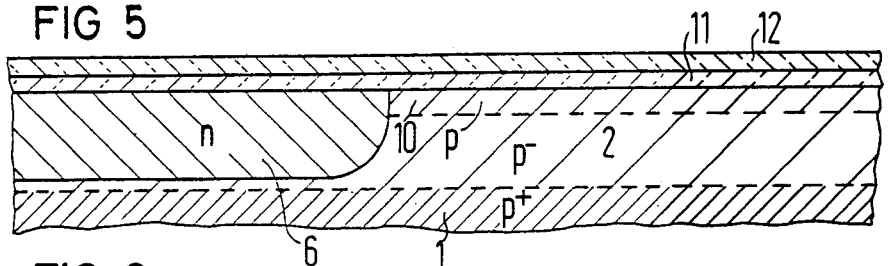

FIG. 5: After removal of the oxide masking 8, a further double layer formed of silicon oxide 11 and silicon nitride 12 is applied to the substrate surface (1, 2, 6, 10).

Figure 6:
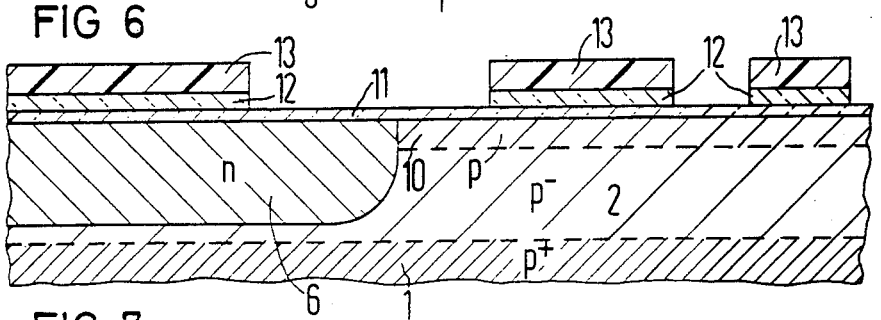

FIG. 6: The silicon nitride layer 12 is structured such that, through use of a photoresist mask 13, it covers the active transport regions in the substrate.

Figure 7:
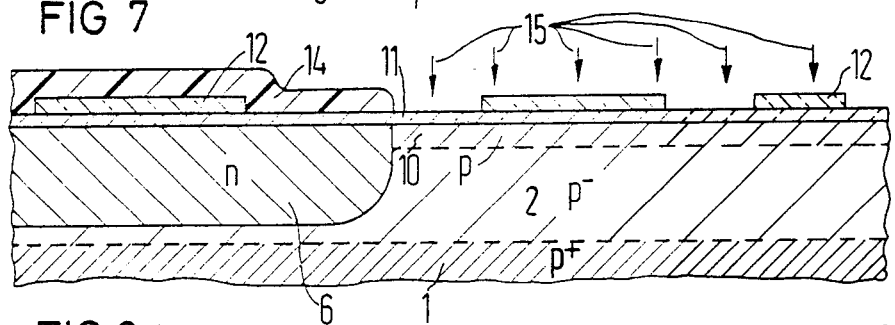

FIG. 7: After stripping the photoresist mask 13, a further photoresist structure 14 for masking the n-tub 6 is generated and the n-channel field implantation (see arrows 15) with boron ions is executed with a dosage and energy of 1 to $2 \times 10^{13}$ cm$^{-2}$ and 25 keV, respectively.

Figure 8:
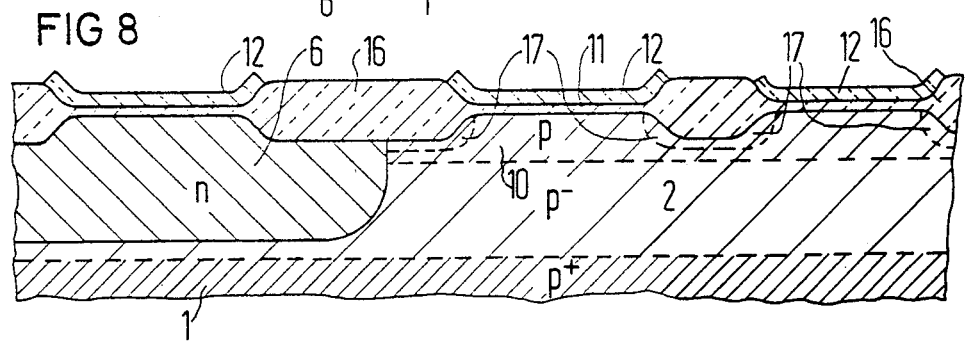

FIG. 8: After stripping the photoresist structure 14, the field oxide regions 16 are generated in a layer thickness of 800 to 1000 nm by means of local oxidation upon use of the silicon nitride layer 12 as masking.

Figure 9:
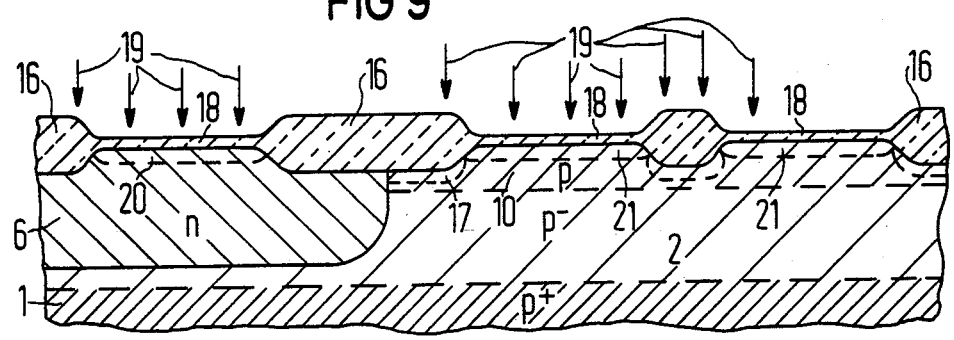

FIG. 9: After stripping the silicon nitride layer 12 and the silicon oxide layer 11, a thermal oxidation of the entire surface is carried out, whereby the thickness of the gate oxide layer 18 is set to 15 to 50 nm. A surface-wide, flat boron ion implantation (see arrows 19) then occurs for the doping of the p-channel and of the n-channel (20, 21). The implantation dosage is selected to match with the other implantations such that as symmetrical as possible a threshold voltage $U_T$ is achieved for the n-channel and for the p-channel. In the present illustrative embodiment, the implantations dosage and energy are set to $4.5 \times 10^{11}$ B+ cm$^{-2}$ and 25 keV, respectively. This corresponds to a threshold voltage $|U_T| = 0.8$ V. Since the ion implantation 19 occurs in surface-wide fashion, no mask is required, in contrast to known CMOS processes.

Figure 10:
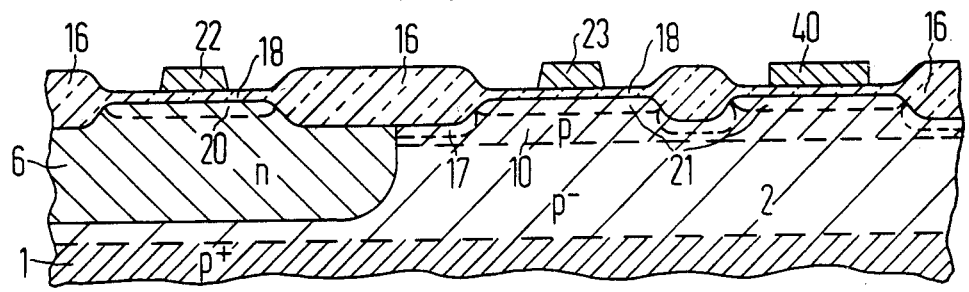

FIG. 10: The deposition of the polysilicon level (500 nm) and its structuring now occur, whereby the gate electrodes 22, 23 and 40 are formed.

Figure 11:
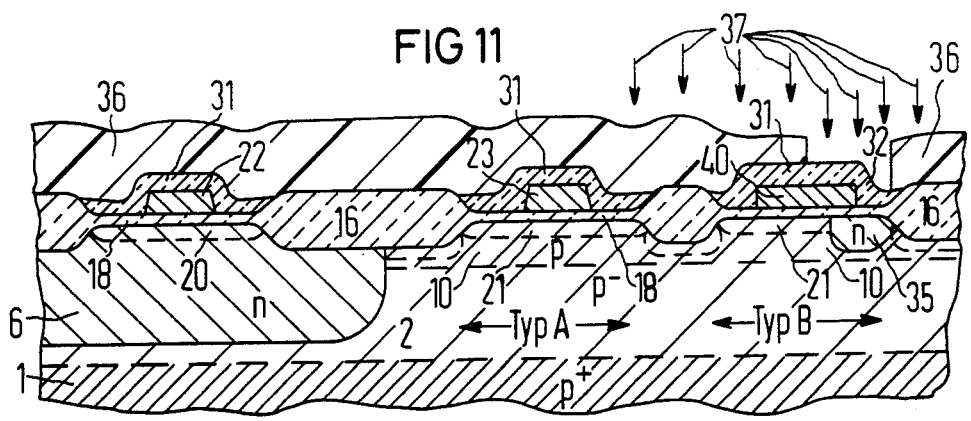

FIG. 11: After execution of an oxidation process, the arising oxide layer 31 in the n-tub region 6 does not mask after completion of the source/drain implantation of the p-channel transistors, but can have a masking effect in the region of the polysilicon edge. A masking 36 consists of photoresist applied to the p-channel transistor regions (6,18,20,22), to the n-channel transistors (10,18,21,23) of the A-type, and to the source region (34) as well as to the field oxide edge of the drain region (35) of the n-channel transistors of the B-type. The first phosphorous ion implantation of the invention and identified by the arrows 37 is executed with an energy and dosage of $1 \times 10^{14}$ cm$^{-2}$ and 80 keV respectively in the drain region 35 of the B-type transistor. The oxide layer 32 on the flanks of the poly-Si gate of the n-channel transistors thus serves for the pull-back of the implantation edge (S/D pull-back). The drain zone 35 of the B-type transistor arises by means of in-diffusion of the phosphorous ions 37 (drive-in step) in about 3 hours at 1000° C. after the mask 36 is stripped.

Figure 12:
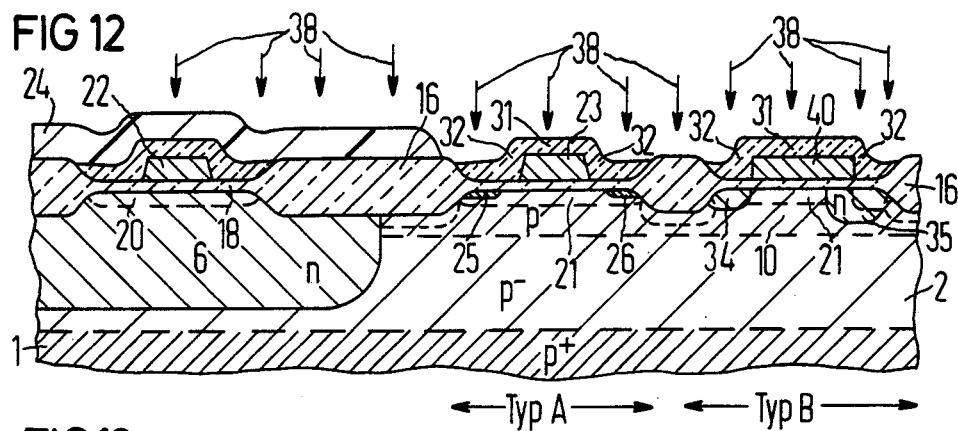

FIG. 12: After masking the n-tub regions 6 with a photoresist mask 24, the actual phosphorous ion implantation 38 for generating the source/drain regions of the n-channel transistors of the A-type (25, 26) and of the B-type (34, 35) is now executed. The oxide layer 32 on the flanks of the poly-Si gate of the n-channel transistors thus serves for the pull-back of the implantation edge (S/D pull-back). The dosage and energy are thus set to $3 \times 10^{15}$ cm$^{-2}$ and 90 keV, respectively.

Figure 13:
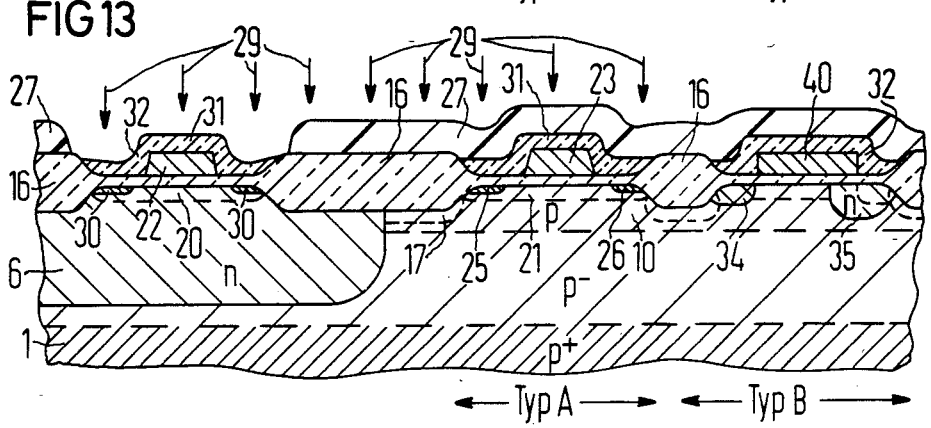

FIG. 13: After stripping the photoresist mask 24, a photoresist mask 27 for masking the n-channel transistor region is applied anew and the surface-wide boron ion implantation (see arrows 29) for generating the source/drain zones 30 of the p-channel transistors in the n-tub 6 is executed. Dosage and energy are thus set to $4 \times 10^{15}$ cm$^{-2}$ and 25 keV, respectively. The oxide layer 32 on the flanks of the poly-Si gate of the p-channel transistors serves for the pull-back of the implantation (S/D pull-back). After stripping the photoresist mask 27, the source/drain regions 30 of the p-channel transistors arise by means of driving in the implanted boron atoms.

The generation of the insulating layer, of the contact hole regions, and of the metal interconnect level occurs according to known method steps of CMOS technology and is not illustrated.

Figure 14:
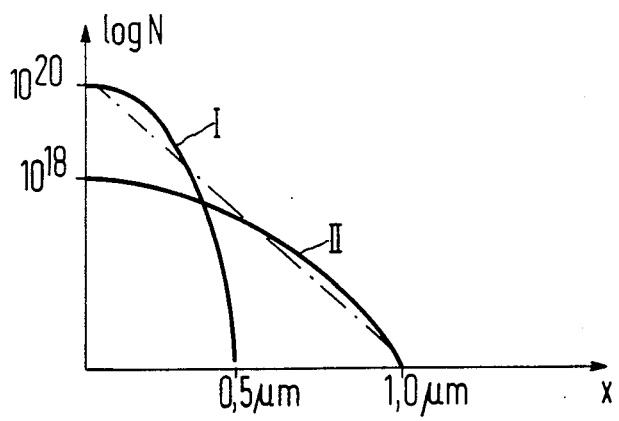
FIG. 14 shows a doping profile in a drain region of a B-type transistor.

FIG. 14 shows the doping profile in the drain region of the B-type transistor. The penetration depth x of the doping atoms in the substrate is on the abscissa and the doping concentration in a logarithmic scale (log N) is on the ordinate. The curve I corresponds to the actual S/D implantation according to method step (u) and the curve II corresponds to the additional implantation according to method steps (s) and (t) executed within the framework of the invention. The additional implantation and the drive-in diffusion are to be selected such that the field progression in front of the pn-junction at the drain side is as soft as possible. This goal is optimally achieved when the doping drop in the logarithmic scale decreases linearly from the polysilicon edge into the channel, since this progression has the smallest doping gradients d (log N)/dx with a given underdiffusion $x_{js}$. This progression (see the dot-dash line) can be achieved in that the additional implantation according to method step (s) and the actual S/D implantation according to method step (u) are both executed with phosphorous, whereby the dosage of the additional implantation lies one to two orders of magnitude below the dosage of the actual implantation. The penetration depth x in the additional drive-in diffusion according to method step (t) is selected about twice as great as the penetration depth of the actual S/D regions.

Although various minor changes and modifications might be proposed by those skilled in the art, it will be understood that we wish to include within the claims of the patent warranted hereon all such changes and modifications as reasonably come within our contribution to the art.

We claim as our invention:

1. A method for simultaneous manufacture of fast short-channel (type A) and voltage-stable (type B) MOS transistors as are employed in VLSI circuits wherein digital and analog functions are integrated on one chip, comprising the steps of:

(a) applying a first double layer of silicon oxide and silicon nitride to a p-doped silicon substrate;

(b) producing an n-tub region by means of an ion implantation wherein the ions are one of the elements selected from the group consisting of phosphorous, arsenic, or antimony ions after completion of masking of remaining regions with a photoresist layer and removal of said silicon nitride layer in said n-tub region;

(c) stripping said photoresist layer;

(d) executing a local oxidation porcess for generating a masking oxide for a following deep boron implantation outside of said n-tub region;

(e) stripping said silicon nitride layer and further driving in the ions for said n-tub;

(f) executing a first deep boron implantation;

(g) surface-wide stripping said oxide masking;

(h) applying a second double layer of silicon oxide and silicon nitride to a surface of the substrate and structuring said silicon nitride layer covered with a photoesist mask such that active transistor regions remain covered by said silicon nitride layer;

(i) stripping said photoresist mask;

(j) applying a further photoresist mask over said n-tub region;

(k) executing a second boron ion implantation for generating an n-channel field implanted region;

(l) stripping said further photoresist mask;

(m) generating a field oxide region by local oxidation by use of said silicon nitride layer as a masking;

(n) removing said silicon nitride layer and oxide layer lying therebelow and executing an oxidation process for manufacture of a gate oxide;

(o) executing a third, surface-wide boron implantation for doping an n-channel outside the n-tub region and a p-channel in the n-tub region and matching an implantation dosage to the other implantations such that as symmetrical as possible a threshold voltage $|U_T|$ is achieved for A-type and B-type transistors formed by the n-channel and transistor formed by the p-channel;

(p) depositing and structuring polysilicon for formation of gate regions for the three transistors;

(q) executing an oxidation process such that the oxide layer does not mask following source/drain impantations of the p-channel and type A and type B n-channel transistors, but can have a masking effect in a region of an edge of the polysilicon gates;

(r) applying a photoresist masking for the p-channel transistor, the A-type n-channel transistor, and the source region as well as an edge of the field oxide of the drain region of the B-type n-channel transistor;

(s) executing a phosphorous ion implantation in the drain region of the B-type n-channel transistor;

(t) in-diffusing the phosphorous ions after stripping said photoresist mask;

(u) executing a further phosphorous ion implantation for generating source/drain regions of the n-channel transistors of A-type and of B-type after masking the n-tub region with photoresist;

(v) executing a photoresist for masking the A-type and B-type n-channel transistor regions;

(w) executing a fourth boron ion implantation for generating source/drain regions of the p-channel transistors;

(x) removing the photoresist masking; and (y) providing insulating layers, contact holes and a metal interconnect level.

2. A method according to claim 1 wherein the dosage and energy of the first phosphorous ion implantation according to method step (s) are set to $5\times10^{13}$–$1\times10^{15}$ cm$^{-2}$ and 80 keV and for second phosphorous ion implantation according to method step (u) are set to $3\times10^{15}$–$3\times10^{16}$ cm$^{-2}$ and 80 keV.

3. A method according to claim 1 wherein said in-diffusion of said phosphorous ions according to method step (t) is undertaken in a region of 1000° C. over a time span of 1–5 hours.

* * * * *